(12) United States Patent
Wang

(10) Patent No.: US 10,141,537 B2
(45) Date of Patent: Nov. 27, 2018

(54) DISPLAY PANEL AND MANUFACTURING METHOD THEREFOR, AND DISPLAY APPARATUS

(71) Applicant: BOE TECHNOLOGY GROUP CO., LTD., Beijing (CN)

(72) Inventor: Dan Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 12 days.

(21) Appl. No.: 15/320,933

(22) PCT Filed: Jun. 5, 2015

(86) PCT No.: PCT/CN2015/080869
§ 371 (c)(1),
(2) Date: Dec. 21, 2016

(87) PCT Pub. No.: WO2016/115806
PCT Pub. Date: Jul. 28, 2016

(65) Prior Publication Data
US 2017/0141350 A1  May 18, 2017

(30) Foreign Application Priority Data

Jan. 23, 2015  (CN) .......................... 2015 1 0036593

(51) Int. Cl.
*H01L 51/52* (2006.01)
*H01L 51/56* (2006.01)
(Continued)

(52) U.S. Cl.
CPC ...... *H01L 51/5246* (2013.01); *H01L 51/0024* (2013.01); *H01L 51/5012* (2013.01);
(Continued)

(58) Field of Classification Search
None
See application file for complete search history.

(56) References Cited

U.S. PATENT DOCUMENTS

2012/0319092 A1*  12/2012  Shimomura ............ B32B 37/06
257/40
2013/0119362 A1   5/2013  Shin
(Continued)

FOREIGN PATENT DOCUMENTS

CN  102447077 A  5/2012
CN  102983279 A  3/2013
(Continued)

OTHER PUBLICATIONS

International Search Report and Written Opinion dated Oct. 23, 2015; PCT/CN2015/080869.
(Continued)

*Primary Examiner* — Shaun Campbell
(74) *Attorney, Agent, or Firm* — Ladas & Parry LLP

(57) ABSTRACT

A display panel and a manufacturing method therefore, and a display apparatus. The display panel comprises: a first substrate (1); a second substrate (2) arranged and attached opposite the first substrate (1), wherein a sealing adhesive layer (3) is provided between the first substrate (1) and the second substrate (2), and the sealing adhesive layer (3) is configured to bond the first substrate (1) and the second substrate (2) to form a sealed structure; and a fusion layer (4), wherein the fusion layer (4) is provided between the sealing adhesive layer (3) and the first substrate (1), and is located corresponding to the sealing adhesive layer (3); and the fusion layer (4) comprises a metal material.

17 Claims, 3 Drawing Sheets

(51) Int. Cl.
H01L 51/00 (2006.01)
H01L 51/50 (2006.01)

(52) U.S. Cl.
CPC ...... *H01L 51/5056* (2013.01); *H01L 51/5072* (2013.01); *H01L 51/5088* (2013.01); *H01L 51/5092* (2013.01); *H01L 51/5206* (2013.01); *H01L 51/5221* (2013.01); *H01L 51/5253* (2013.01); *H01L 51/56* (2013.01); *H01L 2251/301* (2013.01); *H01L 2251/558* (2013.01)

(56) References Cited

U.S. PATENT DOCUMENTS

| | | | |
|---|---|---|---|
| 2013/0134396 A1* | 5/2013 | Shimomura | H01L 51/5012 257/40 |
| 2014/0291629 A1 | 10/2014 | Kim et al. | |
| 2016/0013441 A1* | 1/2016 | Hong | H01L 51/5246 257/40 |

FOREIGN PATENT DOCUMENTS

| | | |
|---|---|---|
| CN | 103500800 A | 1/2014 |
| CN | 103811528 A | 5/2014 |
| CN | 103811668 A | 5/2014 |
| CN | 103943648 A | 7/2014 |
| CN | 104617128 A | 5/2015 |

OTHER PUBLICATIONS

First Chinese Office dated Jan. 3, 2017; Appln. No. 201510036593.1.

* cited by examiner

DISPLAY PANEL AND MANUFACTURING METHOD THEREFOR, AND DISPLAY APPARATUS

TECHNICAL FIELD

Embodiments of the present disclosure relate to a display panel and a manufacturing method thereof, and a display apparatus.

BACKGROUND

In recent years, an organic electroluminescent device (OLED), as a new type of flat panel display apparatus, attracts more and more attention gradually. It will become a next generation of display technology that may replace the liquid crystal display for its characteristics, such as self-illumination, high brightness, high resolution, wide viewing angle, fast response, low power consumption and flexibility or the like. But, an organic layer material in an OLED, is extremely sensitive to water vapor and oxygen, so that the service life of the OLED is greatly decreased. At present, to solve this problem, a method is often used to isolate an organic device from external space by various materials. However, conditions of water vapor and oxygen specifically required in a sealed space that this method needs to satisfy are relatively high.

SUMMARY

Embodiments of the present disclosure provide a display panel. The display panel includes a first substrate; a second substrate provided opposite to the first substrate, a sealing adhesive layer being provided between the first substrate and the second substrate, the sealing adhesive layer being configured to bond the first substrate and the second substrate to form a sealed structure; and a fusion layer, wherein the fusion layer is provided between the sealing adhesive layer and the first substrate and at a region corresponding to the sealing adhesive layer, and the fusion layer includes a metal material.

In an example, the display panel further includes a protective layer, the protective layer being provided on outside of the fusion layer and being in contact with a surface of the first substrate facing the second substrate, and the protective layer covering an outside of the fusion layer.

In an example, the protective layer is provided in a same layer as the fusion layer.

In an example, the first substrate is provided with an OLED display structure, the OLED display structure including: a first electrode, an organic material functional layer, and a second electrode sequentially formed on the substrate; the organic material functional layer including: a hole injection layer, a hole transport layer, an organic light-emitting layer, an electron transport layer and an electron injection layer.

In an example, the metal material includes: iron, nickel, copper, or chromium.

In an example, the fusion layer has a thickness of 3000 Å to 5000 Å.

In an example, a width of a coverage region of the protective layer is in a range of 50 μm to 100 μm.

In an example, the protective layer has a thickness of 3000 Å to 5000 Å.

In an example, the sealing adhesive layer has a thickness of 3 μm to 10 μm.

According to embodiments of the present disclosure, a manufacturing method of a display panel is provided. The method including: providing a first substrate and a second substrate; forming a sealing adhesive layer on the second substrate, wherein the sealing adhesive layer is used to bond the first substrate and the second substrate to form a sealed structure; forming a metal material layer between the sealing adhesive layer and the first substrate, the metal material layer forming a fusion layer at a region corresponding to the sealing adhesive layer; and aligning and press-fitting the first substrate and the second substrate to allow the first substrate and the second substrate to be bonded to form the sealed structure.

Before the aligning and press-fitting the first substrate and the second substrate to allow the first substrate and the second substrate to be bonded to form the sealed structure, forming a protective layer on out periphery of the fusion layer and at a region where the protective layer is in contact with a surface of the first substrate facing the second substrate, and the protective layer covers outside of the fusion layer.

In an example, the method further including: forming a metal thin film between the sealing adhesive layer and the first substrate and at a region corresponding to the sealing adhesive layer; and processing the metal thin film by a patterning process to form a fusion layer.

In an example, the metal material includes iron, nickel, copper, or chromium.

In an example, the first substrate is a substrate having an OLED display structure, the OLED display structure including: a first electrode, an organic material functional layer, and a second electrode sequentially formed on the substrate; and the organic material functional layer including a hole injection layer, a hole transport layer, an organic light emitting layer, an electron transport layer and an electron injection layer.

In an example, the method further including: processing the press-fitted display panel by using a high-frequency alternating magnetic field to allow the sealing adhesive to be fused and bonded to the fusion layer, so that the first substrate and the second substrate form a sealed structure.

According to an embodiment of the present disclosure, a display apparatus is provided, which includes the display panel.

BRIEF DESCRIPTION OF THE DRAWINGS

Embodiments of the present disclosure will be illustrated in more details in connection with the drawings so as to enable those skilled in the art to understand the present disclosure more clearly, in which.

DETAILED DESCRIPTION

Figure 1:
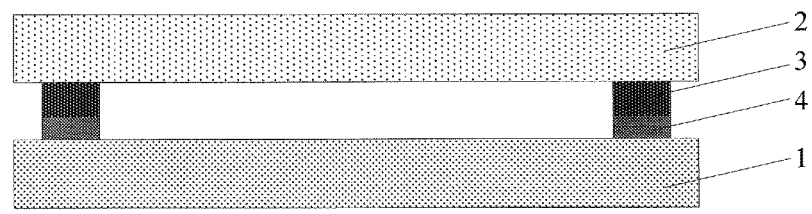
FIG. 1 is a structural schematic diagram of a display panel provided by an embodiment of the present disclosure.

Technical solutions according to the embodiments of the present disclosure will be described clearly and completely as below in conjunction with the accompanying drawings of embodiments of the present disclosure. It is apparent that the described embodiments are only a part of but not all of exemplary embodiments of the present disclosure. Based on the described embodiments of the present disclosure, various other embodiments can be obtained by those of ordinary skill in the art without creative labor and those embodiments shall fall into the protection scope of the present disclosure.

Unless otherwise defined, all the technical and scientific terms used herein have the same meanings as commonly understood by one of ordinary skill in the art to which the present invention belongs. The terms, such as "first," "second," or the like, which are used in the description and the claims of the present application, are not intended to indicate any sequence, amount or importance, but for distinguishing various components. Also, the terms, such as "a/an," "the," or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly.

In a packaging method, frit glass packaging is widely used in packaging of small to medium size OLED devices, which has significant advantages compared with other methods. In this method, glass frit or slurry is firstly dispersed on a packaging substrate, and organic solvent and bonder in the glass slurry are further fritted completely by a high-temperature fritting method, and this fritting temperature is usually between 400° C. and 500° C. After the fritting process is preformed, a glass material is heated and fused by moving a laser beam, and the fused glass material forms a hermetically encapsulated connection between an upper substrate glass and a lower substrate glass, so as to provide hermetical packaging of an airtight type. Fusing of the frit glass is mostly implemented by irradiation of a laser beam, and only a specific frit glass material can absorb energy of a laser. This method needs to use a frit glass material with a specific wavelength which plays a role in absorbing the laser, which greatly limits the application scope and the application materials of the glass packaging technology; and the method for implementing packaging by using a laser needs higher cost and longer time, which results in poor final production efficiency.

Embodiments of the present disclosure provide a display panel and a manufacturing method thereof and a display apparatus, which solves the problem that packaging of the packaging substrate and the array substrate of the display panel can only be implemented by a specific glass material and a specific method, and it also reduces the production cost and the production time. The production efficiency is improved.

According to an embodiment of the present disclosure, a display panel is provided. As shown in FIG. 1, the display panel includes: a first substrate 1 and a second substrate 2 opposite to the first substrate 1, a sealing adhesive layer 3 being provided between the first substrate 1 and the second substrate 2. The sealing adhesive layer 3 is used for bonding the first substrate 1 and the second substrate 2 to form a sealed structure. The display panel also includes a fusion layer 4.

The fusion layer 4 is provided between the sealing adhesive layer 3 and the first substrate 1 and is provided at a region corresponding to the sealing adhesive layer 3.

The fusion layer 4 is made of a metal material.

It is noted that, the first substrate 1 may be an array substrate, and the second substrate 2 may be a packaging substrate. The array substrate 1 is defined by a plurality of gate lines Gate and a plurality of data lines Data horizontally and vertically intersecting with each other to form a plurality of sub-pixels. Each sub-pixel is provided with a thin film transistor (TFT). The thin film transistor is a semiconductor unit with a switching characteristic, which can be of a top-gate type, or can be of a bottom-gate type, however, embodiments of the present disclosure are not limited thereto.

A top-gate type or a bottom-gate type is defined by positions of a gate electrode and a drain electrode and a source electrode with respect to a base substrate. For example, if the gate electrode is closer to the base substrate of the array substrate with respect to the drain electrode and the source electrode, it is the thin film transistor of the bottom-gate type. If the drain electrode and the source electrode are closer to the base substrate of the array substrate with respect to the gate electrode, it is the thin film transistor of the top-gate type. In the embodiments of the present disclosure, it is illustrated with the thin film transistor of the bottom-gate type as an example. The thin film transistor also includes a gate insulating layer and an active layer.

A material of the sealing adhesive layer may be a frit glass material or the like, and the sealing adhesive layer has a thickness of 3 μm to 10 μm.

In the display panel, a mode that the fusion layer is provided in a region corresponding to the sealing adhesive layer and between the sealing adhesive layer and the first substrate is used. The fusion layer is made of a metal material. The metal material will generate current under an action of a changing magnetic field, and the current flowing in the conductor will generate heat, so that the sealing adhesive layer in contact with the fusion layer is heated, and the material in the sealing adhesive layer is fused, so as to bond the first substrate and the second substrate together to form a hermetically sealed structure.

The display panel provided according to the embodiment of the present disclosure, includes the first substrate and the second substrate opposite to the first substrate, the sealing adhesive layer being provided between the first substrate and the second substrate, the fusion layer being provided between the sealing adhesive layer and the first substrate in the display panel and at a region corresponding to the sealing adhesive layer, and the fusion layer being made of a metal material. The material of this fusion layer can fuse the material of the sealing adhesive layer during the heating process, so that the fusion layer and the sealing adhesive layer are bonded together, i.e., the first substrate and the second substrate are bonded to form a sealed structure by using the sealing adhesive layer and the fusion layer. In this way, it solves the problem that packaging of the packaging substrate and the array substrate of the display panel can be implemented only by a specific glass material and a specific method, which reduces production cost, and shortens production time, and the production efficiency is improved.

Figure 2:
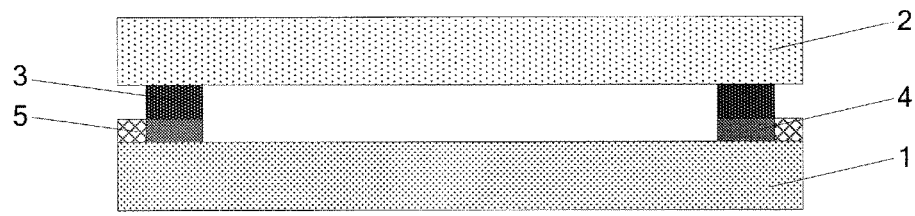
FIG. 2 is a structural schematic diagram of another display panel provided by an embodiment of the present disclosure.

According to another embodiment of the present disclosure, as shown in FIG. 2, the display panel also includes: a protective layer 5.

The protective layer 5 is provided on the outside of the fusion layer 4 and is in contact with a surface of the first substrate 1 facing the second substrate 2.

The protective layer 5 surrounds an outside of the fusion layer 4.

The protective layer 5 is provided in a same layer as the fusion layer 4.

The protective layer may be made of a material, such as silicon nitride, silicon oxynitride, or silicon oxide which can isolate the fusion layer from the air.

The protective layer has a thickness of 3000 Å to 5000 Å. A width of a coverage region of the protective layer is in a range of 50 μm to 100 μm.

In this embodiment, the protective layer is provided to have a thickness of 3000 Å to 5000 Å, and a width of 50 μm to 100 μm, so that protection of the fusion layer can be implemented, while the fusion layer is protected from oxidation in contact with the air, amount of production material used can be reduced, cost is lowered, and production resources are saved, so that the display panel finally formed has a higher value and better market prospects.

For example, the first substrate 1 is provided with an OLED display structure (not shown). The OLED display structure includes a first electrode, an organic material functional layer, and a second electrode sequentially formed on the substrate. The organic material functional layer includes a hole injection layer, a hole transport layer, an organic light-emitting layer, an electron transport layer and an electron injection layer (not shown).

The first electrode may be made of a transparent conductive material, such as indium tin oxide, or indium zinc oxide. The second electrode may be made of a metal material. When the material of the second electrode is at least one of metal aluminum or metal silver, the display panel may be used as a mirror when the display panel is in a non-working state because metal aluminum or metal silver has a relatively high reflectivity. In this way, a mirror display can be prepared.

The metal material of the fusion layer may include metals, such as iron, nickel, copper, or chromium. By using the magnetic metal materials listed herein, it is possible to better release sufficient heat during a magnetic field irradiation process to allow the fusing of the material of the sealing adhesive layer, and to implement a hermetically bonded structure between the first substrate and the second substrate. These metal materials are used here as examples, but embodiments of the present disclosure are not limited to only these metal materials. For example, those materials which can generate current in an alternating magnetic field to fuse the material of the sealing adhesive layer can also be used in the embodiments of the present disclosure.

The fusion layer has a thickness of 3000 Å to 5000 Å.

In this embodiment, the thickness of the fusion layer is provided to be 3000 Å to 5000 Å, which can reduce production cost while fuse the material of the sealing adhesive layer, and resources is saved.

It is noted that, in this embodiment, after the first substrate and the second substrate provided by oppositely assembled together is obtained, and the first substrate and the second substrate are directly provided with the sealing adhesive layer, the fusion layer, and the protective layer, a high-frequency alternating magnetic field may be applied to the display panel externally, to implement that under an action of the changing magnetic field, the fusion layer generates current to further release heat, which fuses the fusion layer so as to hermetically bond the first substrate and the second substrate together. Intensity and frequency of the magnetic field in the high-frequency alternating magnetic field may be set according to the thickness of the fusion layer and the material used in actual design.

The display panel provided by the embodiment of the present disclosure, includes the first substrate and the second substrate opposite to the first substrate. The sealing adhesive layer is provided between the first substrate and the second substrate. The fusion layer is provided between the sealing adhesive layer and the first substrate and at a region corresponding to the sealing adhesive layer, and the fusion layer being made of a metal material. In this way, the fusion layer can fuse the material of the sealing adhesive layer during the heating process, so that the fusion layer and the sealing adhesive layer are bonded together, i.e., the first substrate and the second substrate are bonded to form the hermetically sealed structure by using the sealing adhesive layer and the fusion layer, which solves the problem that packaging of the packaging substrate and the array substrate of the display panel can only be implemented by a specific glass material and a specific method, and it can reduce production cost and shorten production time. The production efficiency is improved.

Figure 3:
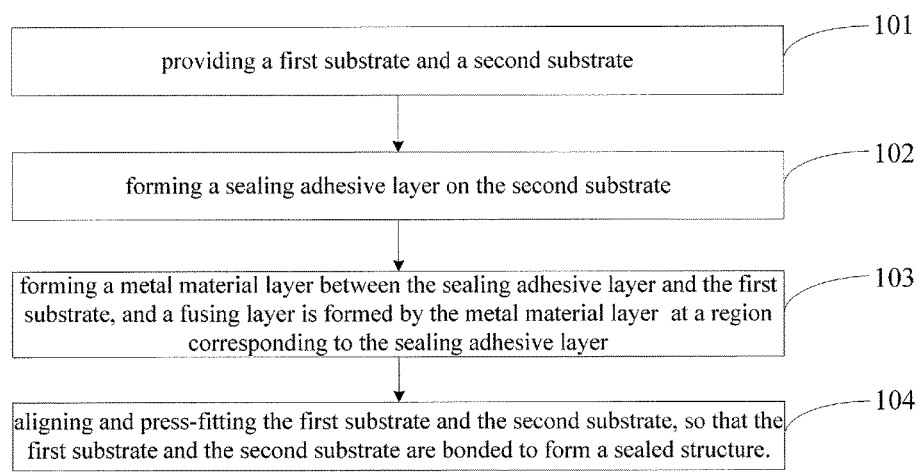
FIG. 3 is a flow diagram of a manufacturing method of a display panel provided by an embodiment of the present disclosure.

According to another embodiment of the present disclosure, a manufacturing method of a display panel is provided. As shown in FIG. 3, the method includes following steps.

101: providing a first substrate and a second substrate.

The first substrate may be an array substrate, and the second substrate may be a packaging substrate.

102: forming a sealing adhesive layer on the second substrate.

The sealing adhesive layer is used for bonding the first substrate and the second substrate to form a hermetically sealed structure.

A thin film of a frit glass material with a thickness of 3 μm to 10 μm is formed by silk-screen printing or coating on a surface of the second substrate, then, the frit thin film obtained is placed and heated in an oven of nitrogen or oxygen atmosphere, so that an organic component in the frit thin film is fully removed and the frit thin film is cured. A temperature of the oven may be set between 350° C. and 500° C.

103: forming, by using a metal material, a fusion layer between the sealing adhesive layer and the first substrate, and at a region corresponding to the sealing adhesive layer.

The fusion layer may have a thickness between 3000 Å and 5000 Å.

104: aligning and press-fitting the first substrate and the second substrate, so that the first substrate and the second substrate are bonded to form a sealed structure.

It is possible to apply an alternating magnetic field outside the first substrate and the second substrate press-fitted, so that the fusion layer generates current to further release heat, which fuses the material of the sealing adhesive layer, so as to implement hermetical bonding of the first substrate and the second substrate.

In the manufacturing method of the display panel provided by the embodiment of the present disclosure, the first substrate and the second substrate are provided oppositely to each other, the sealing adhesive layer is provided between the first substrate and the second substrate, the fusion layer is provided between the sealing adhesive layer and the first substrate and at a region corresponding to the sealing adhesive layer, and the fusion layer includes a metal material. In this way, the material of the fusion layer can fuse the material of the sealing adhesive layer during the heating process, so that the fusion layer and the sealing adhesive layer are bonded together, i.e., the first substrate and the second substrate are bonded to form a sealed structure by using the sealing adhesive layer and the fusion layer. In this way, it solves the problem that packaging of the packaging substrate and the array substrate of the display panel can only be implemented by a specific glass material and a specific method, which reduces production cost and shortens production time. The production efficiency is improved.

Figure 4:
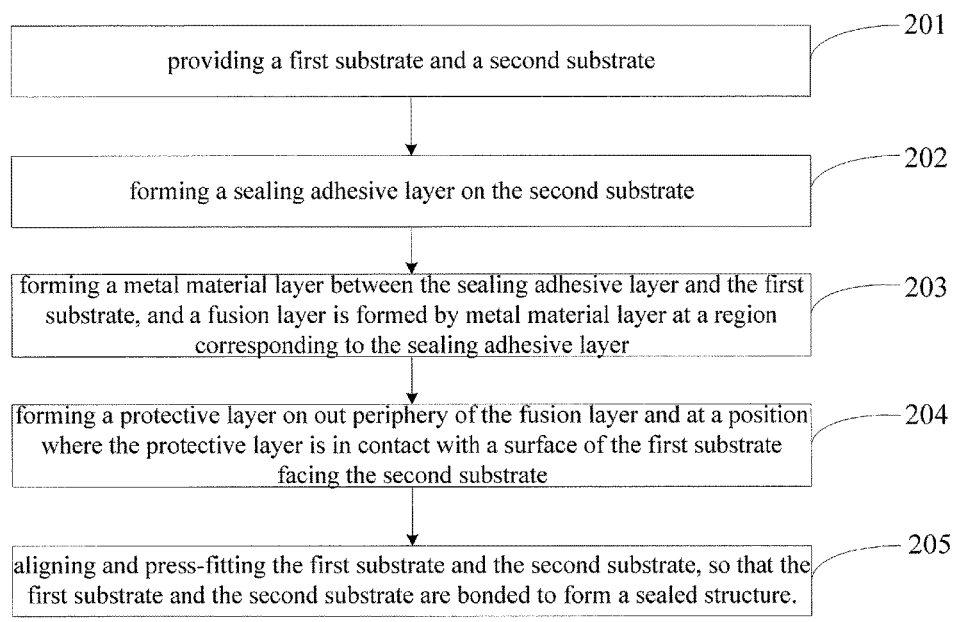
FIG. 4 is a flow schematic diagram of another manufacturing method of a display panel provided by an embodiment of the present disclosure.

According to another embodiment of the present disclosure, a manufacturing method of a display panel is provided. As shown in FIG. 4, the method includes following steps.

201: providing a first substrate and a second substrate.

202: forming a sealing adhesive layer on the second substrate.

The sealing adhesive layer is used for bonding the first substrate and the second substrate to form a hermetically sealed structure.

203: forming a metal material layer between the sealing adhesive layer and the first substrate, a fusion layer is formed by metal material layer at a region corresponding to the sealing adhesive layer.

204: forming a protective layer on periphery of the fusion layer and at a region where the protective layer is in contact with a surface of the first substrate facing the second substrate.

The protective layer covers outside of the fusion layer.

A thin film of the protective layer may be deposited with a thickness of 3000 Å to 5000 Å, and a width of coverage of 50 μm to 100 μm on the periphery of the fusion layer and at the region where the protective layer is in contact with the surface of the first substrate facing the second substrate by using a chemical vapor deposition process or a magnetron sputtering process, and the thin film of the protective layer is made of silicon nitride, and silicon oxide, silicon oxynitride or the like.

205: aligning and press-fitting the first substrate and the second substrate, so that the first substrate and the second substrate are bonded to form the hermetically sealed structure.

It is noted that, description of the flow in this embodiment which is same as the steps of the above-described embodiment is similar as the description in the above-described embodiment, which will not be repeated here.

In the manufacturing method of the display panel provided by the embodiment of the present disclosure, the first substrate and the second substrate are provided oppositely to each other, the sealing adhesive layer is provided between the first substrate and the second substrate, the fusion layer is formed between the sealing adhesive layer and the first substrate and at a region corresponding to the sealing adhesive layer, and the fusion layer is made of a metal material. In this way, the material of the fusion layer can fuse the material of the sealing adhesive layer during the heating process, so that the fusion layer and the sealing adhesive layer are bonded together, i.e., the first substrate and the second substrate are bonded to form a sealed structure by using the sealing adhesive layer and the fusion layer. In this way, it solves the problem that packaging of the packaging substrate and the array substrate of the display panel can only be implemented by a specific glass material and a specific method, which reduces production cost and shortens production time. The production efficiency is improved.

Figure 5:
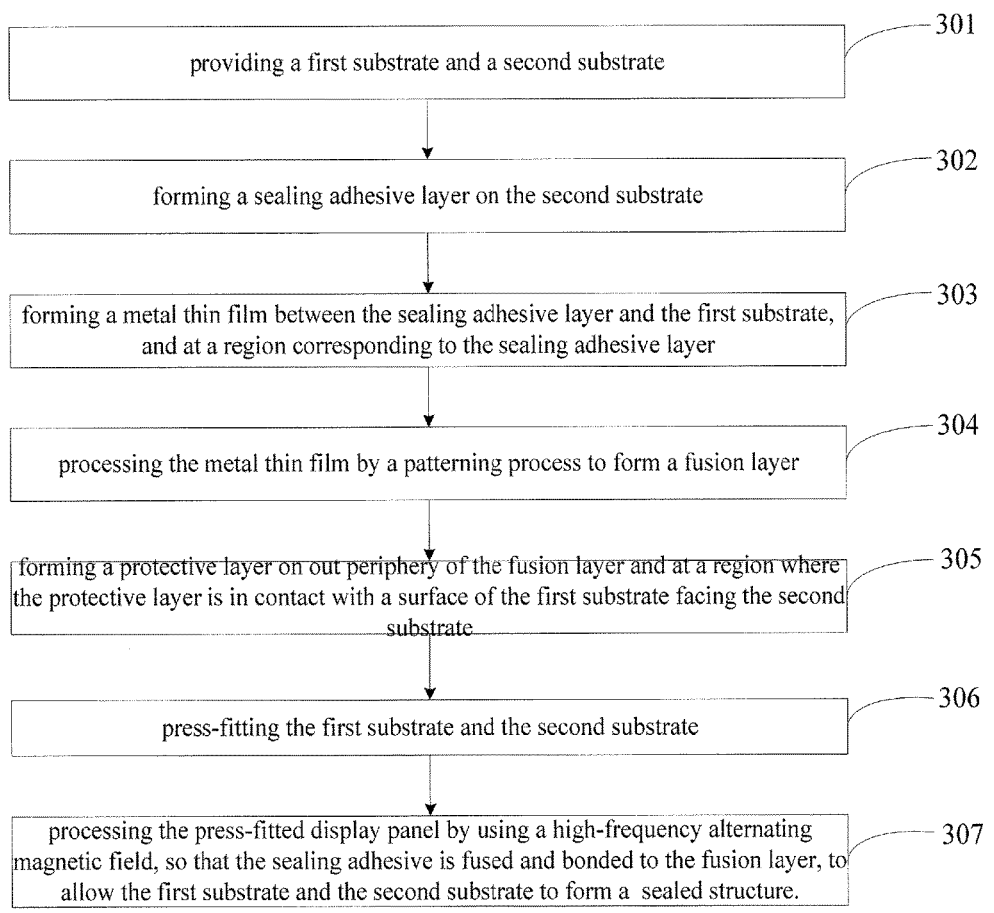
FIG. 5 is a flow schematic diagram of yet another manufacturing method of a display panel provided by an embodiment of the present disclosure.

According to another embodiment of the present disclosure, a manufacturing method of a display panel is provided. As shown in FIG. 5, the method includes following steps.

301: providing a first substrate and a second substrate.

302: forming a sealing adhesive layer on the second substrate.

The sealing adhesive layer is used for bonding the first substrate and the second substrate to form a hermetically sealed structure.

303: forming a metal thin film between the sealing adhesive layer and the first substrate, and at a region corresponding to the sealing adhesive layer.

The metal material includes iron, nickel, copper or chromium, or other magnetic materials.

304: processing the metal thin film by a patterning process to form a fusion layer.

For example, the first substrate is cleaned by cleaning liquid in a cleaning tank, and is automatically cleaned by an air knife and a disk brush in the cleaning tank. The cleaned first substrate is placed in an oven for drying, and water vapor on a surface of the First substrate is cleaned.

A metal thin film with a thickness of 3000 Å to 5000 Å is formed at a corresponding region by using a magnetron sputtering process or a vacuum evaporation process, then, the metal thin film is processed by exposure, development and etching processes to form the fusion layer.

305: forming a protective layer on periphery of the fusion layer and at a region where the protective layer is in contact with a surface of the first substrate facing the second substrate.

The protective layer covers outside of the fusion layer.

306: press-fitting the first substrate and the second substrate.

307: processing the press-fitted display panel by using a high-frequency alternating magnetic field, so that the sealing adhesive is fused and bonded to the fusion layer, to allow the first substrate and the second substrate to form a hermetically sealed structure.

For example, a high-frequency alternating magnetic field may be applied to the display panel externally, and under an action of the changing magnetic field, the fusion layer generates current to further release heat, which fuses the fusion layer so as to hermetically bond the first substrate and the second substrate together. Intensity and frequency of the magnetic field in the high-frequency alternating magnetic field may be set according to the thickness of the fusion layer and the material used in actual design.

It is noted that, description of the flow in this embodiment which is same as the steps of the above-described embodiment is similar as the description in the above-described embodiment, which will not be repeated here.

In the manufacturing method of the display panel provided by the embodiment of the present disclosure, the first substrate and the second substrate are provided oppositely to each other, the sealing adhesive layer is provided between the first substrate and the second substrate, the fusion layer is provided between the sealing adhesive layer and the first substrate and at a region corresponding to the sealing adhesive layer, and the fusion layer is made of a metal material. In this way, the material of the fusion layer can fuse the material of the sealing adhesive layer during the heating process, so that the fusion layer and the sealing adhesive layer are bonded together, i.e., the first substrate and the second substrate are bonded to form a sealed structure by using the sealing adhesive layer and the fusion layer. In this way, it solves the problem that packaging of the packaging substrate and the array substrate of the display panel can only be implemented by a specific glass material and a specific method, which reduces production cost and shortens production time. The production efficiency is improved.

An embodiment of the present disclosure provides a display apparatus, including any one of the display panels provided by the described embodiments. The display apparatus includes a mobile phone, a tablet computer, a television, a laptop computer, a digital photo frame, a navigator and any product or component with display function.

The display apparatus provided by the embodiment of the present disclosure includes the first substrate and the second substrate provided oppositely to each other, the sealing adhesive layer provided between the first substrate and the second substrate, and the fusion layer provided between the sealing adhesive layer and the first substrate of the display panel and at a region corresponding to the sealing adhesive layer, the fusion layer being made of a metal material. In this way, the material of the fusion layer can fuse the material of the sealing adhesive layer during the heating process, so that the fusion layer and the sealing adhesive layer are bonded together, i.e., the first substrate and the second substrate are bonded to form a sealed structure by using the sealing adhesive layer and the fusion layer. In this way, it solves the problem that packaging of the packaging substrate and the array substrate of the display panel can only be implemented by a specific glass material and a specific method, which reduces production cost and shortens production time. The production efficiency is improved.

The described above are only illustrative embodiments and implementations for explaining the present disclosure, and the present disclosure is not intended to limited thereto. For one of ordinary skill in the art, various modifications and improvements may be made without departing from the spirit and scope of embodiments of the present disclosure, and all of the modifications and improvements should fall within the scope of the present disclosure. The scope of the present disclosure is defined by the claims.

The present application claims benefits of and priority to the Chinese Patent Application No. 201510036593.1 filed on Jan. 23, 2015 and entitled 'DISPLAY PANEL AND MANUFACTURING METHOD THEREOF AND DISPLAY APPARATUS', the entire contents of which are incorporated herein by reference.

What is claimed is:
1. A display panel, comprising:
   a first substrate;
   a second substrate provided opposite to the first substrate, a sealing adhesive layer being provided between the first substrate and the second substrate, the sealing adhesive layer being configured to bond the first substrate and the second substrate to form a sealed structure;
   a fusion layer, wherein the fusion layer is provided between the sealing adhesive layer and the first substrate and at a region corresponding to the sealing adhesive layer, and the fusion layer includes a metal material; and
   a protective layer, the protective layer being provided outside of the fusion layer and directly contacting the fusion layer on an outside surface of the fusion layer, and the protective layer being provided with a same thickness as the fusion layer on a surface of the first substrate facing the second substrate.
2. The display panel according to claim 1, wherein the protective layer is provided in a same layer as the fusion layer.
3. The display panel according to claim 1, wherein the first substrate is provided with an OLED display structure, and the OLED display structure includes:
   a first electrode, an organic material functional layer, and a second electrode sequentially formed on the substrate; the organic material functional layer including:
   a hole injection layer, a hole transport layer, an organic light-emitting layer, an electron transport layer and an electron injection layer.
4. The display panel according to claim 1, wherein the metal material includes: nickel, copper, or chromium.
5. The display panel according to claim 1, wherein the fusion layer has a thickness of 3000 Å to 5000 Å.
6. The display panel according to claim 1, wherein a width of a coverage region of the protective layer is in a range of 50 μm to 100 μm.
7. The display panel according to claim 1, wherein the sealing adhesive layer has a thickness of 3 μm to 10 μm.
8. A manufacturing method of a display panel, comprising:
   providing a first substrate and a second substrate;
   forming a sealing adhesive layer on the second substrate, wherein the sealing adhesive layer is used to bond the first substrate and the second substrate to form a sealed structure;
   forming a metal material layer between the sealing adhesive layer and the first substrate, the metal material layer forming a fusion layer at a region corresponding to the sealing adhesive layer;
   forming a protective layer outside of the fusion layer and directly contacting the fusion layer on an outside surface of the fusion layer with a same thickness as the fusion layer on a surface of the first substrate facing the second substrate; and
   aligning and press-fitting the first substrate and the second substrate to allow the first substrate and the second substrate to be bonded to form the sealed structure.
9. The method according to claim 8, further comprising:
   forming a metal thin film between the sealing adhesive layer and the first substrate and at a region corresponding to the sealing adhesive layer; and
   processing the metal thin film by a patterning process to form the fusion layer.
10. The method according to claim 8, wherein the metal material includes: nickel, copper, or chromium.
11. The method according to claim 8, wherein the first substrate is a substrate having an OLED display structure, the OLED display structure including: a first electrode, an organic material functional layer, and a second electrode sequentially formed on the substrate; and the organic material functional layer including: a hole injection layer, a hole transport layer, an organic light emitting layer, an electron transport layer and an electron injection layer.
12. The method according to claim 8, further comprising:
   processing the press-fitted display panel by using a high-frequency alternating magnetic field to allow the sealing adhesive to be fused and bonded to the fusion layer, so that the first substrate and the second substrate form a sealed structure.
13. A display apparatus, comprising a display panel, wherein the display panel comprising:
   a first substrate;
   a second substrate provided opposite to the first substrate, a sealing adhesive layer being provided between the first substrate and the second substrate, the sealing adhesive layer being configured to bond the first substrate and the second substrate to form a sealed structure;
   a fusion layer, wherein the fusion layer is provided between the sealing adhesive layer and the first substrate and at a region corresponding to the sealing adhesive layer, and the fusion layer includes a metal material; and a protective layer, the protective layer being provided outside of the fusion layer and directly contacting the fusion layer on an outside surface of the fusion layer, and the protective layer being provided with a same thickness as the fusion layer on a surface of the first substrate facing the second substrate.

14. The display panel according to claim 2, wherein the first substrate is provided with an OLED display structure, and the OLED display structure includes a first electrode, an organic material functional layer, and a second electrode sequentially formed on the substrate; the organic material functional layer including: a hole injection layer, a hole transport layer, an organic light-emitting layer, an electron transport layer and an electron injection layer.

15. The display panel according to claim 14, wherein the metal material includes: nickel, copper, or chromium.

16. The display panel according to claim 15, wherein the fusion layer has a thickness of 3000 Å to 5000 A.

17. The display panel according to claim 16, wherein a width of a coverage region of the protective layer is in a range of 50 μm to 100 μm.

\* \* \* \* \*